(12) United States Patent
Speranza

(10) Patent No.: US 7,462,528 B2
(45) Date of Patent: Dec. 9, 2008

(54) CMOS (COMPLEMENTARY METAL OXIDE SEMICONDUCTOR) TECHNOLOGY WITH LEAKAGE CURRENT MITIGATION

(75) Inventor: Anthony C. Speranza, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/759,472

(22) Filed: Jun. 7, 2007

(65) Prior Publication Data

US 2007/0231990 A1    Oct. 4, 2007

Related U.S. Application Data

(62) Division of application No. 11/161,050, filed on Jul. 21, 2005, now Pat. No. 7,271,044.

(51) Int. Cl.
*H01L 21/8238* (2006.01)

(52) U.S. Cl. .................. 438/199; 257/E21.632

(58) Field of Classification Search .......... 438/199; 257/E21.632, E27.046, E27.064, E27.108
See application file for complete search history.

(56) References Cited

U.S. PATENT DOCUMENTS

| 5,518,945 | A | 5/1996 | Bracchitta et al. |
| 5,770,490 | A | 6/1998 | Frenette et al. |
| 5,960,270 | A | 9/1999 | Misra et al. |
| 5,985,768 | A | 11/1999 | Speranza et al. |
| 6,103,559 | A | 8/2000 | Gardner et al. |
| 6,117,739 | A | 9/2000 | Gardner et al. |
| 6,157,064 | A * | 12/2000 | Huang ................... 257/344 |
| 6,492,249 | B2 * | 12/2002 | Xiang et al. ............ 438/586 |

FOREIGN PATENT DOCUMENTS

WO    WO97/13273    4/1997

* cited by examiner

*Primary Examiner*—Thao P. Le
(74) *Attorney, Agent, or Firm*—Schmeiser, Olsen & Watts; William D. Sabo

(57) ABSTRACT

A method for forming semiconductor transistor. The method comprises providing a structure including (a) a semiconductor region, and (b) first and second dopant source regions on and in direct physical contact with the semiconductor region, wherein each region of the first and second dopant source regions comprises a dielectric material which contains dopants; causing the dopants to diffuse from the first and second dopant source regions into the semiconductor region so as to form first and second source/drain extension regions, respectively, wherein the first and second source/drain extension regions define a channel region disposed between; forming a gate dielectric region on a channel region; and forming a gate region on the gate dielectric region, wherein the gate dielectric region electrically insulates the gate region from the channel region.

4 Claims, 8 Drawing Sheets

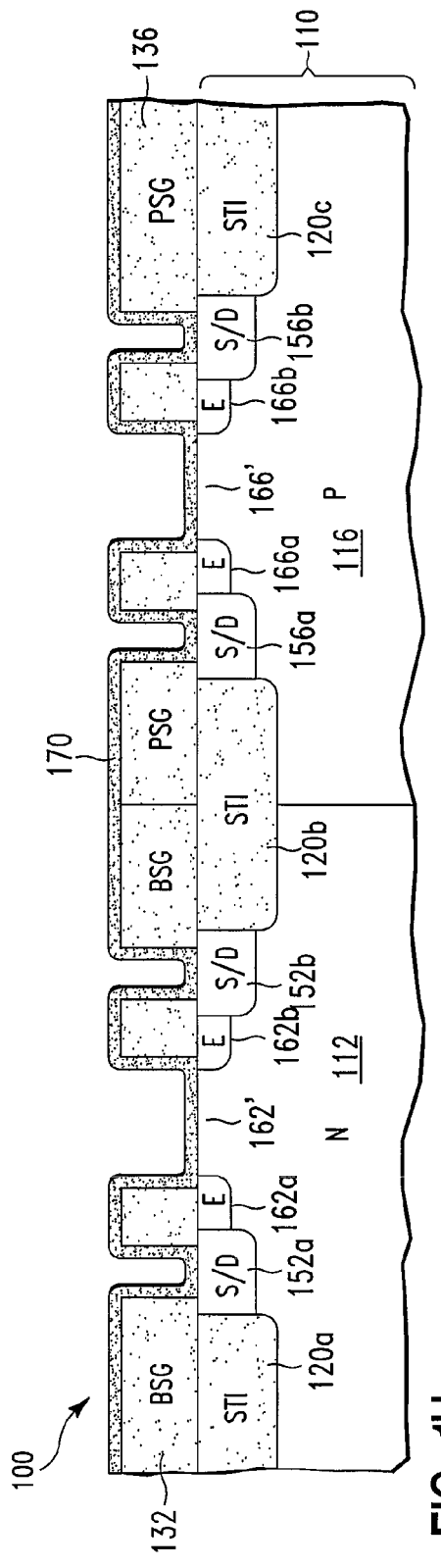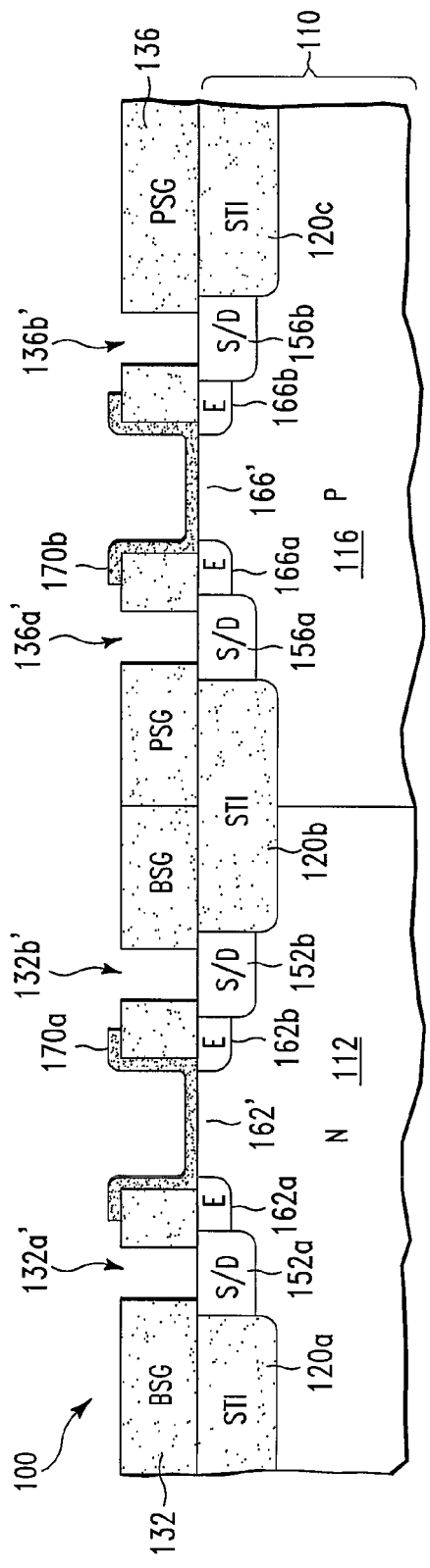

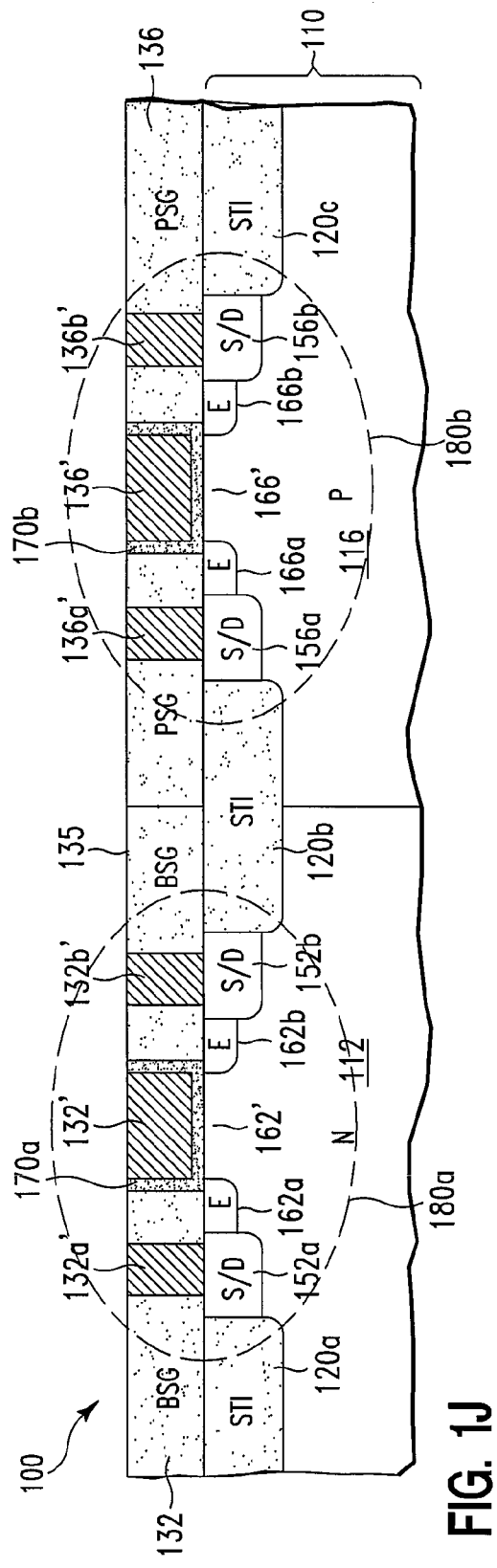
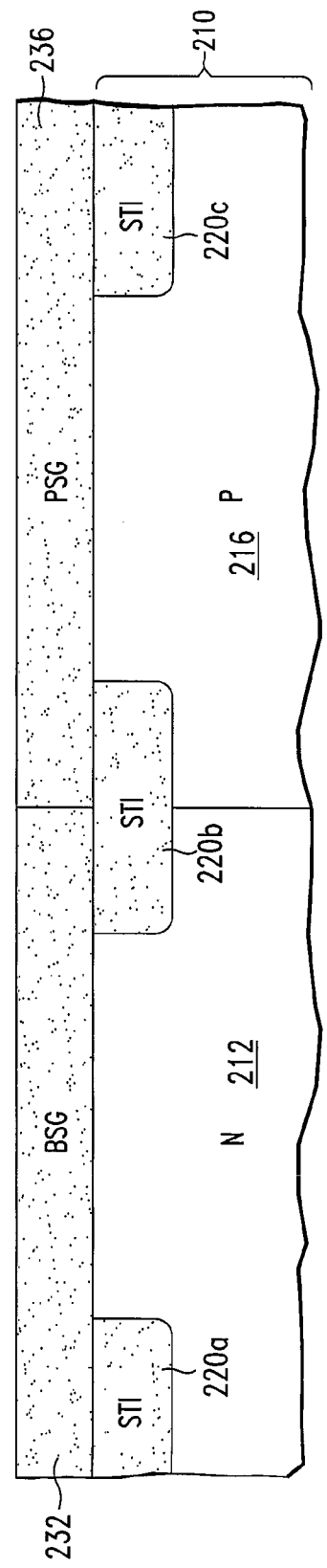
FIG. 1J
FIG. 2A

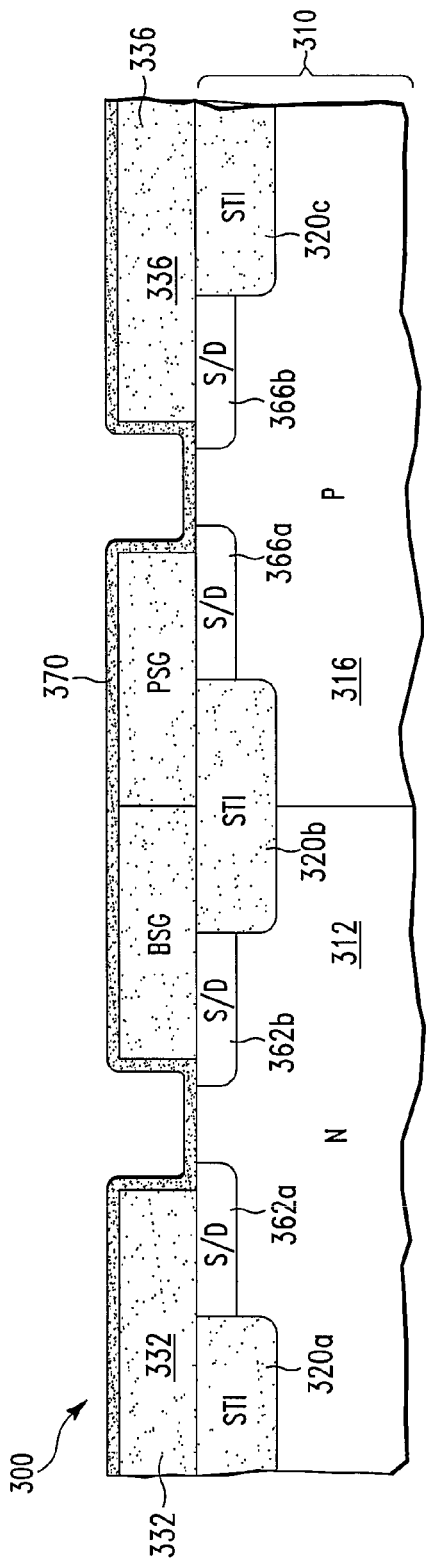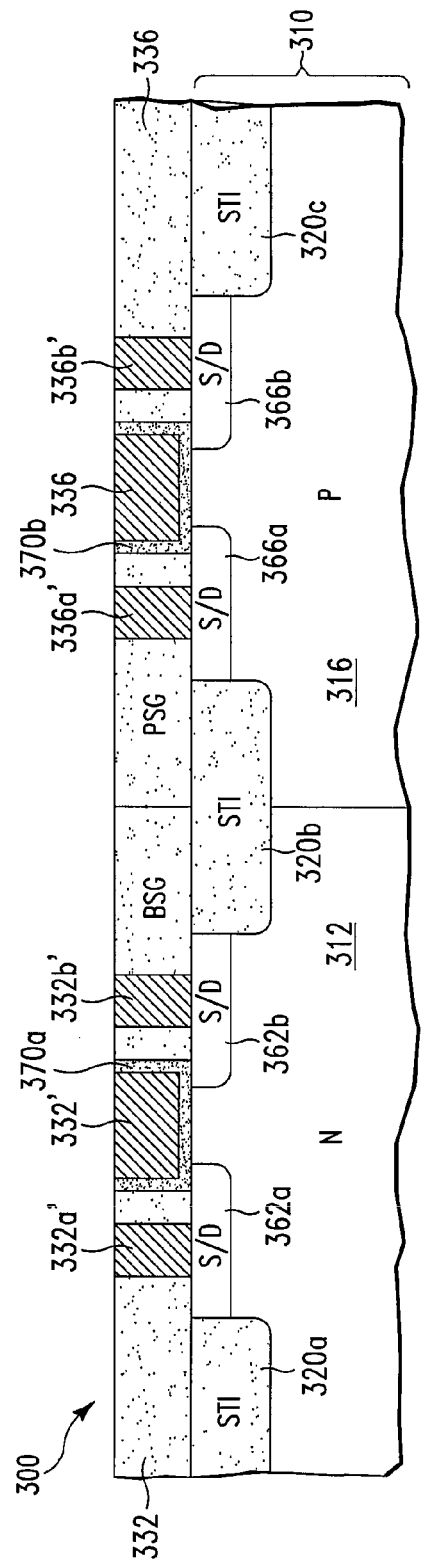
FIG. 3B
FIG. 3C

CMOS (COMPLEMENTARY METAL OXIDE SEMICONDUCTOR) TECHNOLOGY WITH LEAKAGE CURRENT MITIGATION

This application is a divisional of Ser. No. 11/161,050, filed Jul. 21, 2005.

BACKGROUND OF THE INVENTION

1. Technical Field

The present invention relates to CMOS (Complementary Metal Oxide Semiconductor) technology, and more specifically, to improvements to CMOS technology.

2. Related Art

In traditional CMOS (Complementary Metal Oxide Semiconductor) technology, the fabrication of a semiconductor transistor comprises (a) forming a gate stack (including a polysilicon gate region on a gate dielectric region) on a semiconductor layer, and (b) forming first and second source/drain (S/D) regions (i) in the semiconductor layer and (ii) aligned with the gate stack. The first and second S/D regions define a channel region in the semiconductor layer and directly beneath the gate dielectric region. As device dimensions continue to shrink (i.e., scaling), the gate dielectric region that electrically insulates the channel region and the polysilicon gate region of the transistor becomes thinner and therefore experiences increasing leakage current due to direct carrier tunneling, resulting in degraded device performance.

As a result, there is a need for methods of forming transistors in which leakage current problem is mitigated.

SUMMARY OF THE INVENTION

The present invention provides a structure formation method, comprising providing a structure including (a) a semiconductor region comprising a semiconductor region top surface, and (b) first and second dopant source regions on and in direct physical contact with the semiconductor region top surface, wherein each region of the first and second dopant source regions comprises a first dielectric material which contains first dopants; causing the first dopants to diffuse from the first and second dopant source regions into the semiconductor region so as to form first and second source/drain extension regions, respectively, in the semiconductor region, wherein the first and second source/drain extension regions define a channel region in the semiconductor region, and wherein the channel region is (i) disposed between and in direct physical contact with the first and second source/drain extension regions and (ii) in direct physical contact with the semiconductor region top surface; forming a gate dielectric region on the channel region after said causing the first dopants to diffuse is performed; and forming a gate region on the gate dielectric region, wherein the gate dielectric region electrically insulates the gate region from the channel region.

The present invention also provides a structure formation method, comprising providing a structure including (a) a semiconductor region comprising a semiconductor region top surface, and (b) first and second dopant source regions on and in direct physical contact with the semiconductor region top surface, wherein each region of the first and second dopant source regions comprises a first dielectric material which contains first dopants; forming a diffusion barrier region (i) on and in direct physical contact with the semiconductor region top surface and (ii) in direct physical contact with the first and second dopant source regions; causing the first dopants to diffuse from the first and second dopant source regions into the semiconductor region so as to form first and second source/drain extension regions, respectively, in the semiconductor region after said forming the diffusion barrier region is performed, wherein the first and second source/drain extension regions define a channel region in the semiconductor region, and wherein the channel region is (i) disposed between and in direct physical contact with the first and second source/drain extension regions and (ii) in direct physical contact with the semiconductor region top surface; removing the diffusion barrier region after said causing the first dopants to diffuse is performed; forming a gate dielectric region on the channel region after said removing the diffusion barrier region is performed; forming a gate region on the gate dielectric region, wherein the gate dielectric region electrically insulates the gate region from the channel region; and forming first and second contact regions (i) in the first and second dopant source regions, respectively, (ii) not in direct physical contact with the gate region, and (iii) in direct physical contact with the first and second source/drain extension regions, respectively.

The present invention also provides a structure formation method, comprising providing a structure including (a) a semiconductor region comprising a semiconductor region top surface, and (b) first, second, third, and fourth dopant source regions on and in direct physical contact with the semiconductor region top surface, wherein each region of the first and second dopant source regions comprises a first dielectric material which contains first dopants, wherein each region of the third and fourth dopant source regions comprises a second dielectric material which contains second dopants, wherein the first and second dopants have opposite dopant polarities, and wherein the second and third dopant source regions are in direct physical contact with each other; causing the first dopants to diffuse from the first and second dopant source regions into the semiconductor region so as to form first and second source/drain extension regions, respectively, in the semiconductor region, wherein the first and second source/drain extension regions define a first channel region in the semiconductor region, and wherein the first channel region is (i) disposed between and in direct physical contact with the first and second source/drain extension regions and (ii) in direct physical contact with the semiconductor region top surface; causing the second dopants to diffuse from the third and fourth dopant source regions into the semiconductor region so as to form third and fourth source/drain extension regions, respectively, in the semiconductor region, wherein the third and fourth source/drain extension regions define a second channel region in the semiconductor region, and wherein the second channel region is (i) disposed between and in direct physical contact with the third and fourth source/drain extension regions and (ii) in direct physical contact with the semiconductor region top surface, and wherein the second and third source/drain extension regions are not in direct physical contact with each other; forming a first gate dielectric region on the first channel region after said causing the first dopants to diffuse and said causing the second dopants to diffuse are performed; forming a second gate dielectric region on the second channel region after said causing the first dopants to diffuse and said causing the second dopants to diffuse are performed; forming a first gate region on the first gate dielectric region, wherein the first gate dielectric region electrically insulates the first gate region from the first channel region; and forming a second gate region on the second gate dielectric region, wherein the second gate dielectric region electrically insulates the second gate region from the second channel region.

The present invention provides methods of forming transistors in which leakage current problem is mitigated.

BRIEF DESCRIPTION OF THE DRAWINGS

FIGS. 1A-1J illustrate the steps of a first transistor fabrication method, in accordance with embodiments of the present invention.

FIGS. 2A-2D illustrate the steps of a second transistor fabrication method, in accordance with embodiments of the present invention.

FIGS. 3A-3C illustrate the steps of a third transistor fabrication method, in accordance with embodiments of the present invention.

DETAILED DESCRIPTION OF THE INVENTION

Figure 1A:
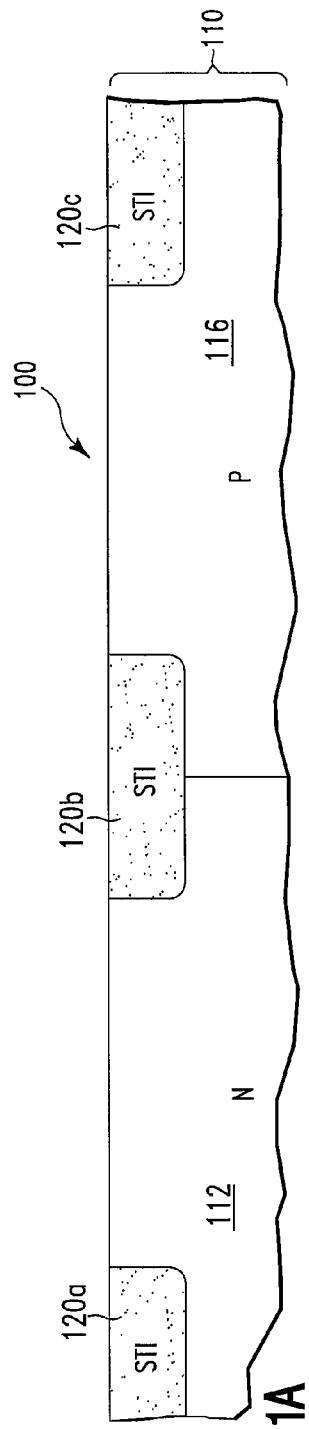

FIGS. 1A-1J illustrate the steps of a first transistor fabrication method for forming a semiconductor structure 100, in accordance with embodiments of the present invention. More specifically, with reference to FIG. 1A, in one embodiment, the first transistor fabrication method starts out with a semiconductor (e.g., silicon, germanium, etc.) layer 110.

Next, in one embodiment, shallow trench isolation (STI) regions 120a, 120b, and 120c are formed in the Si layer 110, using any conventional method.

Next, in one embodiment, a region 112 of the Si layer 110 is doped with N type dopants (e.g., phosphorous atoms) so as to form the N well 112 in the Si layer 110, using any conventional method. Next, in one embodiment, a region 116 of the Si layer 110 is doped with P type dopants (e.g., boron atoms) so as to form the P well 116 in the Si layer 110, using any conventional method.

Figure 1B:
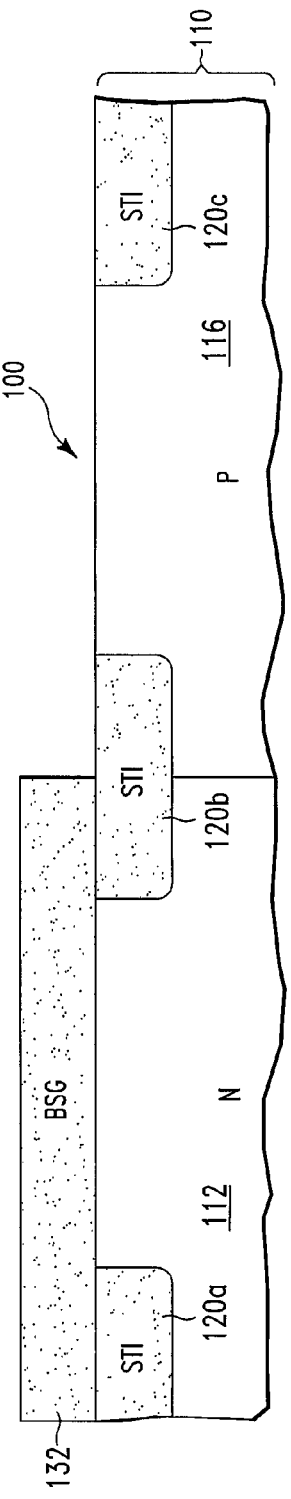

Next, with reference to FIG. 1B, in one embodiment, a BSG (boron silicate glass) region 132 is formed on top of the N well 112. Illustratively, the BSG region 132 is formed by (i) blanket depositing a BSG layer (not shown) on the structure 100 of FIG. 1A by CVD (chemical vapor deposition), and then (ii) directionally and selectively etching back the deposited BSG layer stopping at the Si layer 110, such that what remains of the BSG layer is the BSG region 132.

Figure 1C:
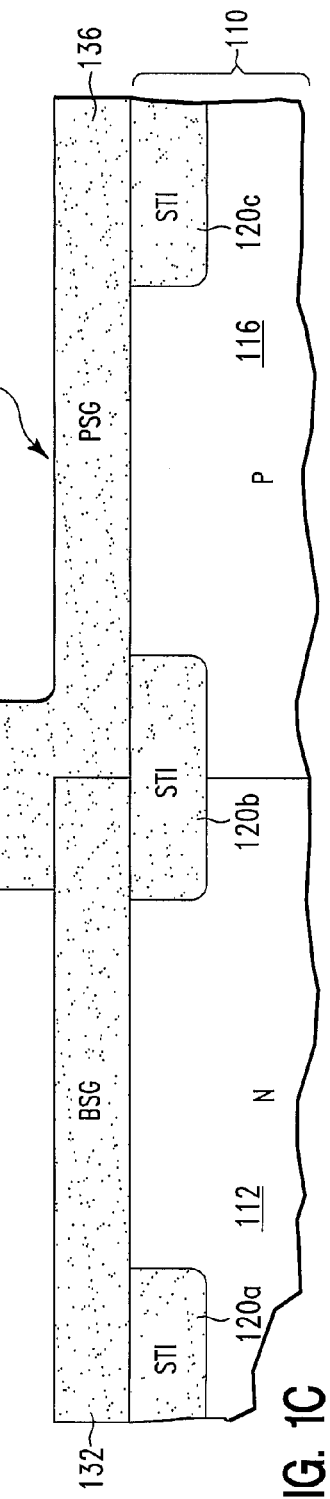

Next, with reference to FIG. 1C, in one embodiment, a PSG (phosphorous silicate glass) region 136 is formed on top of the P well 116 and the BSG region 132. Illustratively, the PSG region 136 is formed by (i) blanket depositing a PSG layer (not shown) on the structure 100 of FIG. 1B by CVD, and then (ii) directionally and selectively etching back the deposited PSG layer, such that what remains of the PSG layer is the PSG region 136. In one embodiment, the BSG region 132 and the PSG region 136 are overlapping (i.e., a portion of the PSG region 136 is directly above the BSG region 132).

Figure 1D:
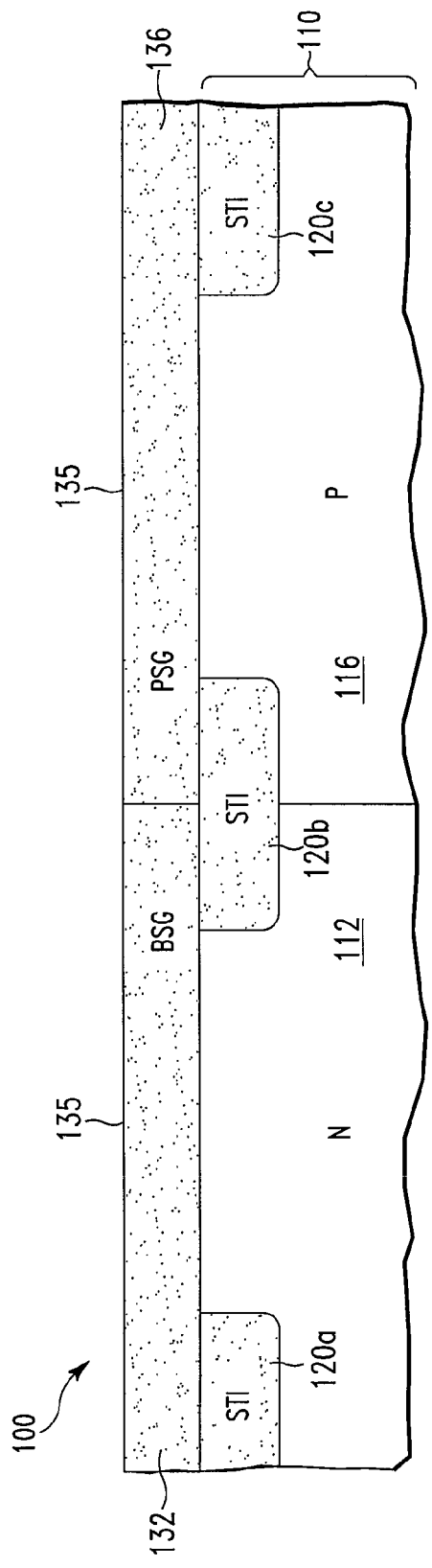

Next, with reference to FIG. 1D, in one embodiment, a CMP (chemical mechanical polishing) step is performed to provide a planar top surface 135 of the structure 100. Because the BSG region 132 and the PSG region 136 are overlapping before the CMP step is performed, the BSG region 132 and the PSG region 136 are in direct physical contact with each other after the CMP step is performed.

Figure 1E:
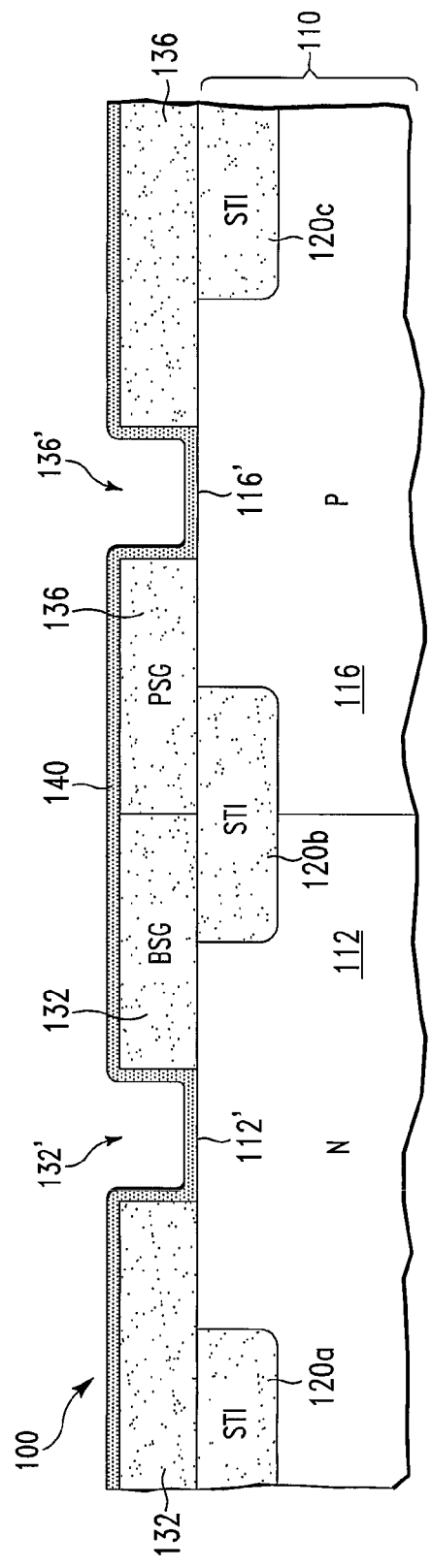

Next, with reference to FIG. 1E, in one embodiment, an opening 132' is created in the BSG region 132 such that a top surface 112' of the N well 112 is exposed to the surrounding ambient through the opening 132'. Similarly, an opening 136' is created in the PSG region 136 such that a top surface 116' of the P well 116 is exposed to the surrounding ambient through the opening 136'. In one embodiment, the openings 132' and 136' are simultaneously created by a conventional lithographic process.

Next, in one embodiment, a diffusion barrier layer 140 (comprising a nitride material for illustration) is blanket deposited on top of the structure 100 by, illustratively, a LPCVD (low pressure CVD) process.

Figure 1F:
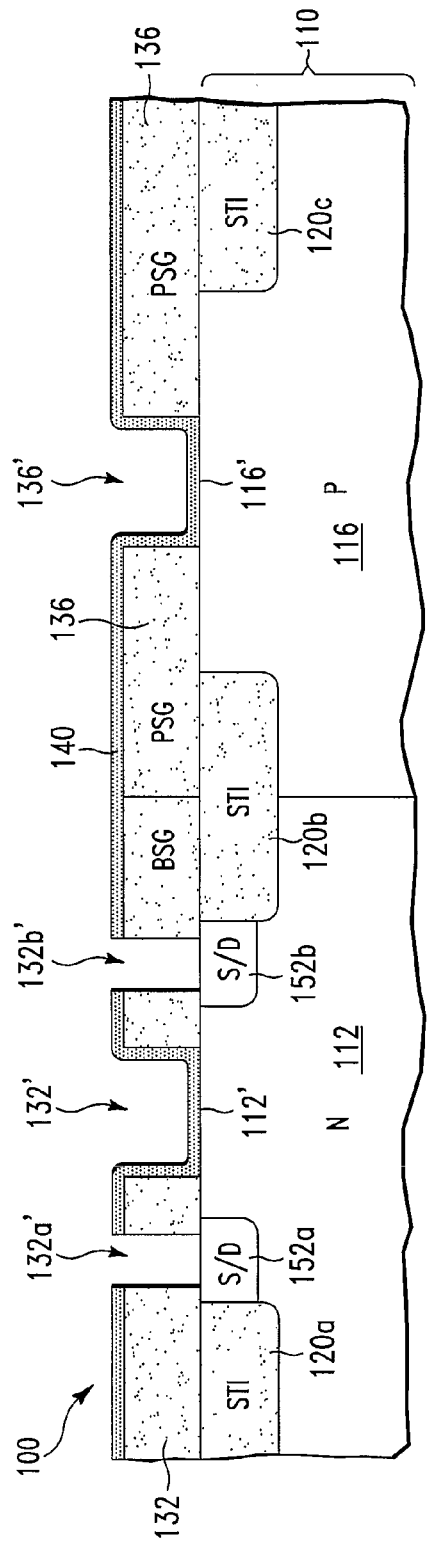

Next, with reference to FIG. 1F, in one embodiment, contact holes 132a' and 132b' are created in the nitride layer 140 and the BSG region 132 using any conventional lithographic process such that the top surface 112' of the N well 112 is exposed to the surrounding ambient through the contact holes 132a' and 132b'. In one embodiment, the opening 132' is disposed between but not in direct physical contact with the contact holes 132a' and 132b'.

Next, in one embodiment, S/D regions 152a and 152b are formed (i) in the N well 112 and (ii) directly beneath the contact holes 132a' and 132b', respectively. Illustratively, the S/D regions 152a and 152b are formed by ion implantation of boron ions through the contact holes 132a' and 132b'.

Figure 1G:
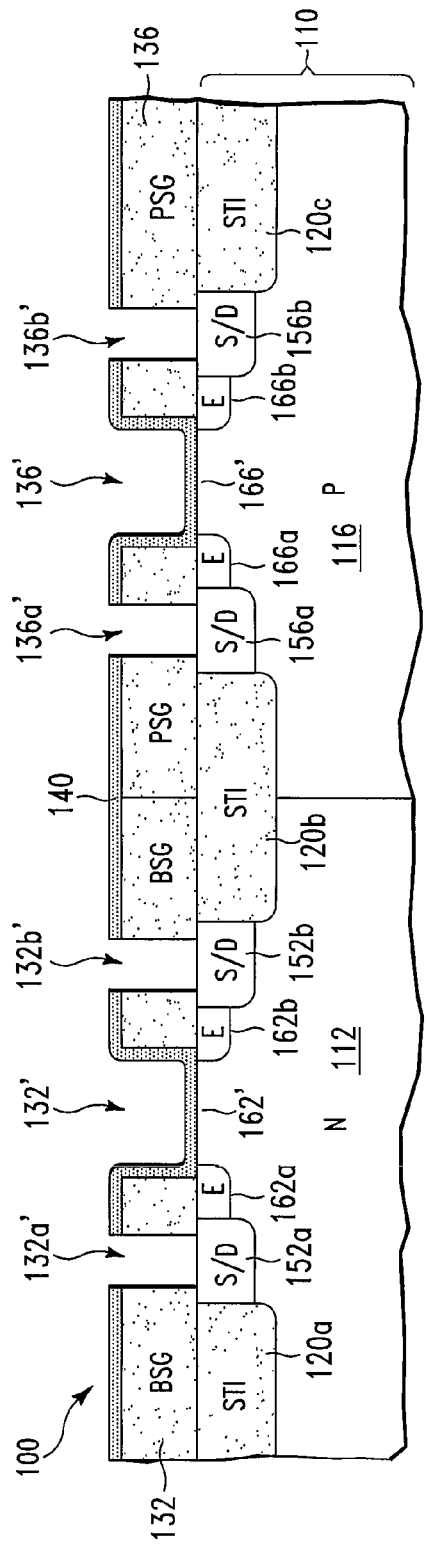

Next, with reference to FIG. 1G, in one embodiment, contact holes 136a' and 136b' are created in the nitride layer 140 and the PSG region 136 using any conventional lithographic process such that the top surface 116' of the P well 116 is exposed to the surrounding ambient through the contact holes 136a' and 136b'. In one embodiment, the opening 136' is disposed between but not in direct contact with the contact holes 136a' and 136b'.

Next, in one embodiment, S/D regions 156a and 156b are formed (i) in the P well 116 and (ii) directly beneath the contact holes 136a' and 136b', respectively. Illustratively, the S/D regions 156a and 156b are formed by ion implantation of phosphorous ions through the contact holes 136a' and 136b'.

Next, in one embodiment, S/D extension regions 162a and 162b are formed (i) in the N well 112, (ii) on two opposing sides of the opening 132', and (iii) in direct physical contact with the S/D regions 152a and 152b, respectively while S/D extension regions 166a and 166b are formed (i) in the P well 116, (ii) on two opposing sides of the opening 136', and (iii) in direct physical contact with the S/D regions 156a and 156b, respectively. Illustratively, the S/D extension regions 162a, 162b, 166a, and 166b are formed by a rapid thermal anneal (RTA) process that (i) causes some boron dopants to diffuse from the BSG region 132 directly into the N well 112 resulting in the S/D extension regions 162a and 162b and (ii) causes some phosphorous dopants to diffuse from the PSG region 136 directly into the P well 116 resulting in the S/D extension regions 166a and 166b. In one embodiment, the rapid thermal anneal process that forms the S/D extension regions 162a, 162b, 166a, and 166b is also used to activate the S/D regions 152a, 152b, 156a, and 156b.

It should be noted that some boron dopants also diffuse from the S/D regions 152a and 152b into the S/D extension regions 162a and 162b, respectively and that some phosphorous dopants also diffuse from the S/D regions 156a and 156b into the S/D extension regions 166a and 166b, respectively.

The S/D extension regions 162a and 162b define a channel region 162' (i) in the N well 112 and (ii) disposed between the S/D extension regions 162a and 162b, whereas the S/D extension regions 166a and 166b define a channel region 166' (i) in the P well 116 and (ii) disposed between the S/D extension regions 166a and 166b.

It should be noted that the presence of a diffusion barrier layer such as the nitride diffusion barrier layer 140 (i) prevents boron dopants from diffusing from the BSG region 132 indirectly into the channel region 162' via the ambient and (ii) prevents phosphorous dopants from diffusing from the PSG region 136 indirectly into the channel region 166' via the ambient.

Next, in one embodiment, the nitride layer 140 is removed by, illustratively, a highly selective wet etch step. In one embodiment, hot phosphoric acid can be used for removing the nitride layer 140.

Next, with reference to FIG. 1H, in one embodiment, a gate dielectric layer 170 is blanket deposited on the structure 100 by, illustratively, a CVD or LPCVD process. In one embodiment, the gate dielectric layer 170 comprises a high-K (K is the dielectric constant) dielectric material, wherein K is significantly greater than the dielectric constant of either silicon dioxide (3.9) or silicon nitride (7.9). In one embodiment, the high-K dielectric material has K>10. For example, the gate dielectric layer 170 can comprise hafnium oxide ($HfO_2$) or zirconium oxide ($ZrO_2$).

Next, in one embodiment, a post deposition anneal process is performed so as to stabilize the gate dielectric layer 170. More specifically, the post deposition anneal process may cause the deposited high-K dielectric material to chemically react with silicon where the gate dielectric layer 170 is in direct physical contact with silicon material of the semiconductor layer 110. For example, the post deposition anneal process causes hafnium oxide ($HfO_2$) to chemically react with silicon (Si) to form hafnium silicate (HfSiO), a dielectric material which is more stable than hafnium oxide.

Next, with reference to FIG. 1I, in one embodiment, the gate dielectric layer 170 (FIG. 1G) is patterned (i.e., selectively etched) using any conventional lithography process such that (i) the S/D regions 152a, 152b, 156a, and 156b are again exposed to the surrounding ambient through the contact holes 132a', 132b', 136a', and 136b', respectively, and (ii) the channel regions 162' and 166' are still covered respectively by gate dielectric regions 170a and 170b, remainders of the gate dielectric layer 170 (FIG. 1G).

Next, with reference to FIG. 1J, in one embodiment, the openings 132' and 136' and the contact holes 132a', 132b', 136a', and 136b' are filled with an electrically conducting material (tungsten in one embodiment) so as to form the gate regions 132' and 136' and the contact regions 132a', 132b', 136a', and 136b', respectively. In one embodiment, the gate regions 132' and 136' and the contact regions 132a', 132b', 136a', and 136b' are simultaneously formed by (i) blanket depositing a tungsten layer (not shown) on top of the structure 100 of FIG. 1I, then (ii) planarizing the top surface 135 of the structure 100 (using CMP in one embodiment).

It should be noted that the structure 100 of FIG. 1J comprises a P channel transistor 180a and an N channel transistor 180b which can be coupled so as to form a CMOS structure. It should also be noted that using the first transistor fabrication method described above, each transistor of the P channel transistor 180a and the N channel transistor 180b can be formed independently from the other.

In an alternative embodiment, the regions 132', 132a', and 132b' comprising a first electrically conducting material are formed first using any conventional method. Next, the regions 136', 136a', and 136b' comprising a second electrically conducting material are formed using any conventional method. In one embodiment, the first and second electrically conducting materials comprise first and second metals, respectively, whose work functions are different from each other and are selected so as to optimize the operations of the transistors 180a and 180b, respectively.

Figure 2B:
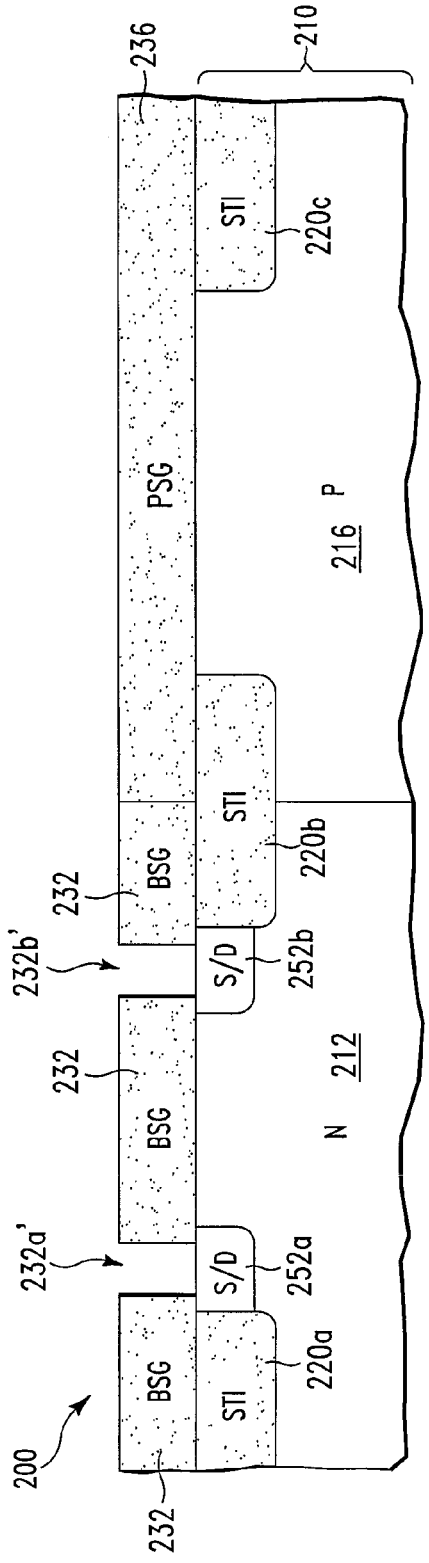

FIGS. 2A-2D illustrate the steps of a second transistor fabrication method for forming a semiconductor structure 200, in accordance with embodiments of the present invention. More specifically, with reference to FIG. 2A, in one embodiment, the second transistor fabrication method starts out with a structure 200 similar to the structure 100 of FIG. 1D. In one embodiment, the method for forming the structure 200 of FIG. 2A is similar to the method for forming the structure 100 of FIG. 1D. For simplicity, all reference numerals herein have three numeric digits starting with the numeric figure number. In addition, similar regions have the identical reference numerals except for the first digit which is used to indicate the numeric figure number. For example, the Si layer 110 (FIG. 1A) and the Si layer 210 (FIG. 2A) are similar.

Next, with reference to FIG. 2B, in one embodiment, contact holes 232a' and 232b', similar to the contact holes 132a' and 132b', respectively (FIG. 1F), are created in the BSG region 232 using any conventional lithographic process. In one embodiment, the method for forming the contact holes 232a' and 232b' is similar to the method for forming the contact holes 132a' and 132b' (FIG. 1F).

Next, in one embodiment, S/D regions 252a and 252b, similar to the S/D regions 152a and 152b, respectively (FIG. 1F) are formed (i) in the N well 212 and (ii) directly beneath the contact holes 232a' and 232b', respectively. In one embodiment, the method for forming the S/D regions 252a and 252b is similar to the method for forming the S/D regions 152a and 152b (FIG. 1F).

Figure 2C:
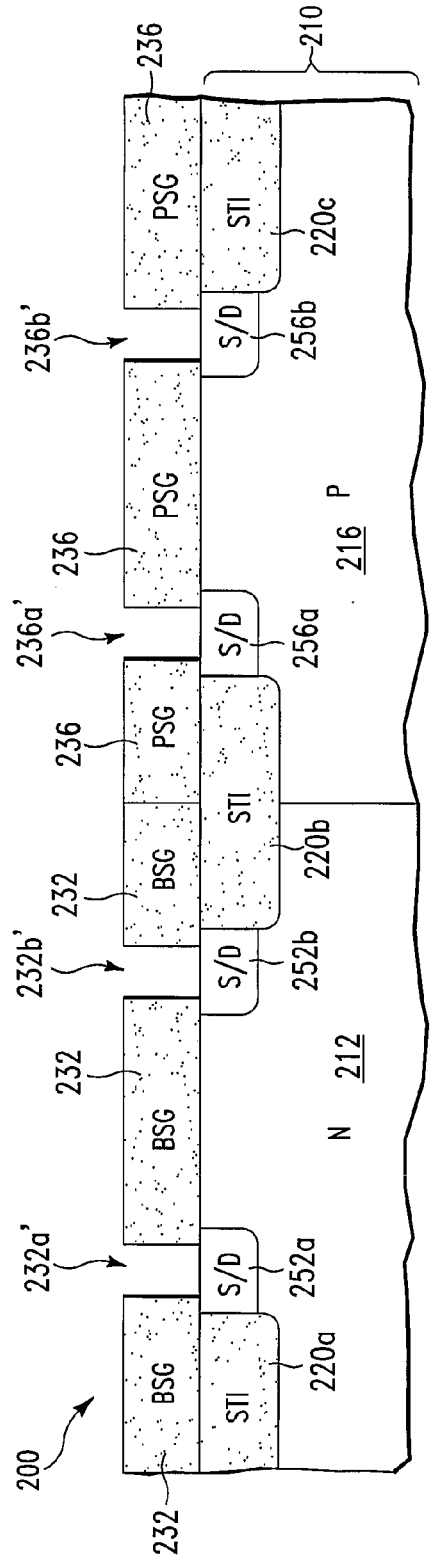

Next, with reference to FIG. 2C, in one embodiment, contact holes 236a' and 2326', similar to the contact holes 136a' and 136b', respectively (FIG. 1G), are created in the PSG region 236 using any conventional lithographic process. In one embodiment, the method for forming the contact holes 236a' and 236b' is similar to the method for forming the contact holes 136a' and 136b' (FIG. 1G).

Next, in one embodiment, S/D regions 256a and 256b, similar to the S/D regions 156a and 156b, respectively (FIG. 1G) are formed (i) in the P well 216 and (ii) directly beneath the contact holes 236a' and 236b', respectively. In one embodiment, the method for forming the S/D regions 256a and 256b is similar to the method for forming the S/D regions 156a and 156b (FIG. 1G).

Figure 2D:
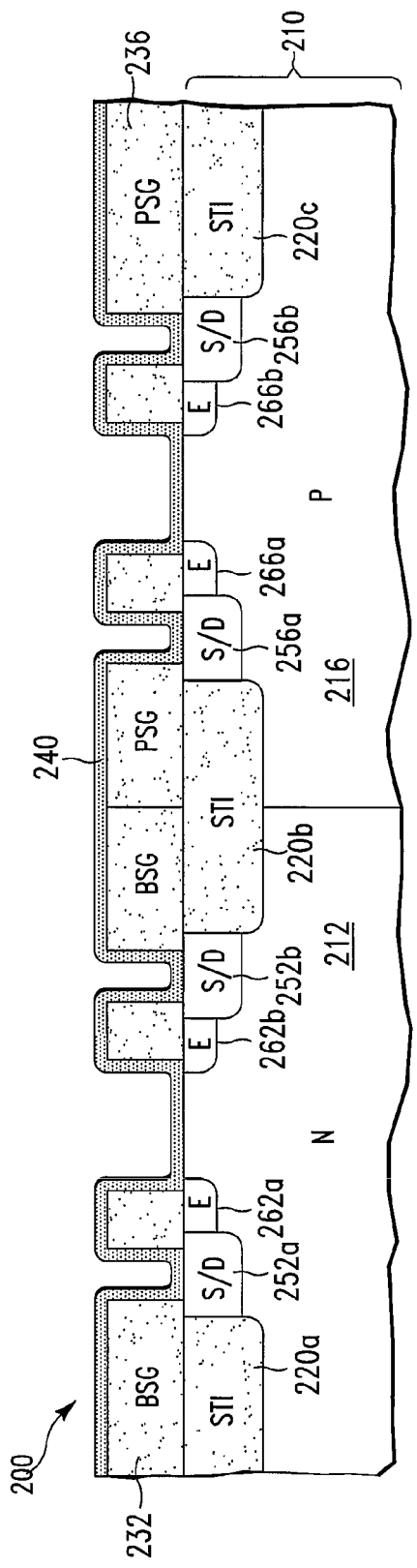

Next, with reference to FIG. 2D, in one embodiment, openings 232' and 236', similar to the openings 132' and 136', respectively (FIG. 1E) are simultaneously created in the BSG region 132 and the PSG region 136, respectively. In one embodiment, the method for creating the openings 232' and 236' is similar to the method for creating the openings 132' and 136' (FIG. 1E).

Next, in one embodiment, a diffusion barrier layer 240 (comprising a nitride material for illustration) is blanket deposited on top of the structure 200 by, illustratively, a LPCVD (low pressure CVD) process.

Next, in one embodiment, S/D extension regions 262a, 262b, 266a, and 266b are simultaneously formed in the Si layer 210 by an anneal process that causes (i) some boron dopants to diffuse from the BSG region 232 directly into the N well 212 resulting in the S/D extension regions 262a and 262b and (ii) some phosphorous dopants to diffuse from the PSG region 236 directly into the P well 216 resulting in the S/D extension regions 266a and 266b. In one embodiment, the anneal process that forms the S/D extension regions 262a, 262b, 266a, and 266b is also used to activate the S/D regions 252a, 252b, 256a, and 256b.

Next, in one embodiment, the nitride layer 240 is removed by, illustratively, a highly selective wet etch step and then a high-K dielectric material is blanket deposited on the structure 200, wherein K is significantly greater than that of either silicon dioxide (3.9) or silicon nitride (7.9). In one embodiment, the high-K dielectric material has K>10. The resulting structure (not shown) is similar to the structure 100 of FIG. 1H. Next, in one embodiment, fabrication steps, similar to those of the first transistor fabrication method described above, can be used to transform the structure 200 into a structure similar to the structure 100 of FIG. 1J.

Figure 3A:
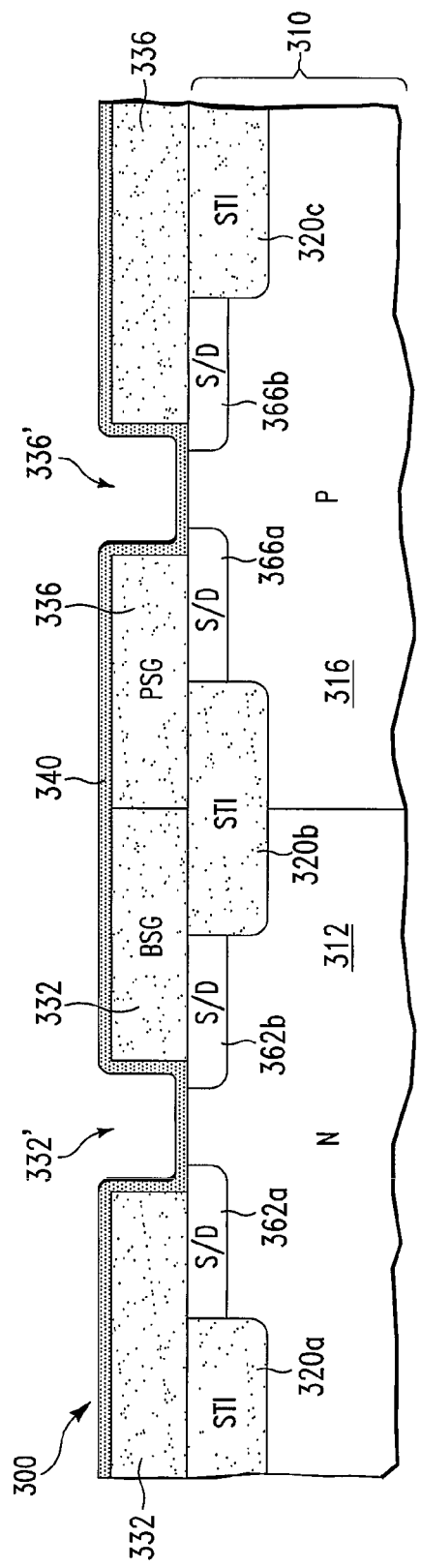

FIGS. 3A-3C illustrate the steps of a third transistor fabrication method for forming a semiconductor structure 300, in accordance with embodiments of the present invention. More specifically, with reference to FIG. 3A, in one embodiment, the third transistor fabrication method starts out with a structure 300 similar to the structure 100 of FIG. 1E. In one embodiment, the method for forming the structure 300 of FIG. 3A is similar to the method for forming the structure 100 of FIG. 1E.

Next, in one embodiment, S/D regions 362a, 362b, 366a, and 366b are simultaneously formed in the Si layer 210 by an anneal process that causes (i) some boron dopants to diffuse from the BSG region 332 directly into the N well 312 resulting in the S/D regions 362a and 362b and (ii) some phosphorous dopants to diffuse from the PSG region 336 directly into the P well 316 resulting in the S/D regions 366a and 366b.

Next, in one embodiment, the nitride diffusion barrier layer 340 is removed by, illustratively, a highly selective wet etch step. In one embodiment, hot phosphoric acid can be used for removing the nitride layer 340.

Next, with reference to FIG. 3B, in one embodiment, a gate dielectric layer 370 is blanket deposited on the structure 300 by, illustratively, a CVD or LPCVD process. In one embodiment, the gate dielectric layer 170 comprises a high-K dielectric material, wherein K is significantly greater than that of either silicon dioxide (3.9) or silicon nitride (7.9). In one embodiment, the high-K dielectric material has K>10. For example, the gate dielectric layer 170 can comprise hafnium oxide ($HfO_2$) or zirconium oxide ($ZrO_2$).

Next, with reference to FIG. 3C, in one embodiment, a gate region 332', similar to the gate region 132' (FIG. 1J) and contact regions 332a' and 332b', similar to the 132a' and 132b', respectively (FIG. 1J) are formed in the BSG region 332, whereas a gate region 336', similar to the gate region 136' (FIG. 1J) and contact regions 336a' and 336b', similar to the 136a' and 136b', respectively (FIG. 1J) are formed in the PSG region 336. In one embodiment, the gate region 332' and 336' and the contact regions 332a', 332b', 336a', and 336b' comprise the same electrically conducting material (tungsten in one embodiment). In one embodiment, the method for forming the gate region 332' and 336' and the contact regions 332a', 332b', 336a', and 336b' is similar to the method for forming the gate region 132' and 136' and the contact regions 132a', 132b', 136a', and 136b' (FIG. 1J).

In summary, with reference to FIG. 1J, the S/D regions 152a and 152b and the S/D extension regions 162a and 162b of the transistor 180a are formed and then activated (by annealing at high temperatures) before the gate dielectric region 170a is formed. As a result, the gate dielectric region 170a can comprise a high-K dielectric material (instead of silicon dioxide) that better mitigates the leakage current problem of the prior art. It should be noted that if the S/D regions 152a and 152b and the S/D extension regions 162a and 162b of the transistor 180a were formed and then activated (by annealing at high temperatures) after the gate dielectric region 170a is formed, such a high-temperature dopant activation would cause the high-K material of the gate dielectric region 170a to become unstable. Similarly, for the transistor 180b, the gate dielectric region 170b can also comprise a high-K dielectric material (instead of silicon dioxide) that better mitigates the leakage current t problem of the prior art.

In one embodiment, the structures in the embodiments described above are fabricated on the same wafer (not shown) as other standard transistors (not shown). For each of these standard transistors, the fabrication of its gate stack (not shown) is performed first, wherein the gate stack comprises (i) a gate dielectric region (not shown) and (ii) a gate electrode region, and wherein the gate dielectric region is sandwiched between and electrically insulates a channel region in the wafer and the gate electrode region. Next, the gate stack is used as a blocking mask for implanting source/drain regions in the wafer aligned with the gate stack, followed by an anneal step to activate the source/drain regions of the standard transistor. In other words, the fabrication steps of the structures in the embodiments described above can be integrated with the fabrication steps of the standard transistors such that both can be fabricated on the same wafer.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A structure formation method, comprising:
    providing a structure including:
        (a) a semiconductor region comprising a semiconductor region top surface, and
        (b) first and second dopant source regions on and in direct physical contact with the semiconductor region top surface, wherein each region of the first and second dopant source regions comprises a first dielectric material which contains first dopants;
    forming a diffusion barrier region (i) on and in direct physical contact with the semiconductor region top surface and (ii) in direct physical contact with the first and second dopant source regions;
    causing the first dopants to diffuse from the first and second dopant source regions into the semiconductor region so as to form first and second source/drain extension regions, respectively, in the semiconductor region after said forming the diffusion barrier region is performed,
        wherein the first and second source/drain extension regions define a channel region in the semiconductor region, and
        wherein the channel region is (i) disposed between and in direct physical contact with the first and second source/drain extension regions and (ii) in direct physical contact with the semiconductor region top surface;
    removing the diffusion barrier region after said causing the first dopants to diffuse is performed;
    forming a gate dielectric region on the channel region after said removing the diffusion barrier region is performed;
    forming a gate region on the gate dielectric region, wherein the gate dielectric region electrically insulates the gate region from the channel region; and
    forming first and second contact regions (i) in the first and second dopant source regions, respectively, (ii) not in direct physical contact with the gate region, and (iii) in direct physical contact with the first and second source/drain extension regions, respectively.

2. The method of claim 1, wherein the first dielectric material comprises boron silicate glass.

3. The method of claim 1, wherein the first dielectric material comprises phosphorous silicate glass.

4. The method of claim 1, wherein the gate dielectric region comprises a second dielectric material having a dielectric constant greater than 10.

* * * * *